(12) United States Patent
Zhang et al.

(10) Patent No.: US 12,308,237 B2
(45) Date of Patent: May 20, 2025

(54) ION IMPLANTATION TO INCREASE MOSFET THRESHOLD VOLTAGE

(71) Applicant: Applied Materials, Inc., Santa Clara, CA (US)

(72) Inventors: Qintao Zhang, Mt Kisco, NY (US); Samphy Hong, Saratoga Springs, NY (US); Wei Zou, Lexington, MA (US)

(73) Assignee: Applied Materials, Inc., Santa Clara, CA (US)

( * ) Notice: Subject to any disclaimer, the term of this patent is extended or adjusted under 35 U.S.C. 154(b) by 724 days.

(21) Appl. No.: 17/541,459

(22) Filed: Dec. 3, 2021

(65) Prior Publication Data

US 2023/0178373 A1 Jun. 8, 2023

(51) Int. Cl.
*H01L 21/266* (2006.01)
*H01L 21/04* (2006.01)
*H10D 62/832* (2025.01)

(52) U.S. Cl.
CPC ........ *H01L 21/266* (2013.01); *H01L 21/0465* (2013.01); *H10D 62/8325* (2025.01)

(58) Field of Classification Search
CPC ........ H01L 21/02529; H01L 21/02378; H01L 21/02447; H01L 21/265–266; H01L 29/1608; H01L 29/66545
See application file for complete search history.

(56) References Cited

U.S. PATENT DOCUMENTS

| | | | |
|---|---|---|---|
| 5,030,580 A * | 7/1991 | Furukawa | H01L 21/046 257/E21.057 |
| 11,302,776 B1 * | 4/2022 | Sundaresan | H10D 62/8325 |
| 2004/0266149 A1 * | 12/2004 | Kwak | H01L 21/266 257/E21.345 |
| 2008/0135953 A1 * | 6/2008 | Siprak | H01L 21/2658 257/E21.639 |
| 2010/0048004 A1 * | 2/2010 | Hashimoto | H01L 29/7802 257/E21.334 |
| 2010/0200954 A1 * | 8/2010 | Del Agua Borniquel | H01L 21/2236 257/E29.112 |
| 2016/0133707 A1 * | 5/2016 | Kubota | H01L 21/046 257/77 |
| 2018/0090321 A1 * | 3/2018 | Araoka | H01L 29/51 |
| 2022/0262896 A1 * | 8/2022 | Sheridan | H10D 62/393 |

OTHER PUBLICATIONS

Cai et al., "High-Performance Enhancement-Mode AlGaN/GaN HEMTs Using Fluoride-Based Plasma Treatment," IEEE Electron Device Letters, vol. 26, No. 7, Jul. 2005, pp. 435-437.
(Continued)

*Primary Examiner* — Eric A. Ward
(74) *Attorney, Agent, or Firm* — KDW Firm, PLLC

(57) ABSTRACT

Disclosed herein are methods for increasing MOSFET threshold voltage to enable higher SiC mobility. In some embodiments, a method includes providing a device structure including a dielectric layer over an epitaxial layer, patterning a hardmask layer over the dielectric layer, performing a first ion implant to form a well in the epitaxial layer, and performing a second ion implant to form an interface layer between the well and the dielectric layer.

16 Claims, 4 Drawing Sheets

(56) References Cited

OTHER PUBLICATIONS

Kiong et al., "Influence of Fluorine Implant on Threshold Voltage for Metal Gate FDSOI and MuGFET," 2007 IEEE International SOI Conference Proceedings, 1-4244-0880-6/07 ©2007 IEEE, pp. 35-36.
Cai et al., "Control of Threshold Voltage of AlGaN/GaN HEMTs by Fluoride-Based Plasma Treatment: From Depletion Mode to Enhancement Mode," IEEE Transactions on Electron Devices, vol. 53, No. 9, Sep. 2006, pp. 2207-2215.

* cited by examiner

ION IMPLANTATION TO INCREASE MOSFET THRESHOLD VOLTAGE

FIELD OF THE DISCLOSURE

The present embodiments relate to semiconductor device patterning, and more particularly, to forming MOSFETs using an ion implant to increase threshold voltage.

BACKGROUND OF THE DISCLOSURE

Silicon Carbide (SiC) is an ideal semiconductor material for high voltage, high frequency, and high temperature applications. This is primarily due to the large critical electric field, large bandgap, large thermal conductivity, and large electron saturation velocity of SiC. SiC n-channel MOSFETs are ideal for applications operating at high voltage, high speed, and high frequency.

However, SiC MOSFETs have shown very poor inversion layer mobility, resulting in large power dissipation and loss of efficiency. The lower inversion layer mobility is primarily due to the poor interface between the gate oxide and the silicon carbide substrate through which the current conduction occurs. Specifically, low surface doping concentration and defect concentration are critical to reach high mobility through reducing coulombic scattering. Counter-doping and low well doping concentration are two approaches to improve mobility, but both result in a reduce threshold voltage.

Accordingly, what is needed is an approach for increasing MOSFET threshold voltage.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one aspect, a method may include providing a device structure including a dielectric layer over an epitaxial layer, patterning a hardmask layer over the dielectric layer, performing a first ion implant to form a well in the epitaxial layer, and performing a second ion implant to form an interface layer between the well and the dielectric layer.

In another aspect, a method of forming a MOSFET may include providing a device structure including a dielectric layer directly atop an epitaxial layer, patterning a hardmask layer over the dielectric layer, performing a first ion implant to form a set of wells in the epitaxial layer, performing a second ion implant to form an interface layer between the set of wells and the dielectric layer.

In yet another aspect, a method for increasing MOSFET threshold voltage may include providing a device structure including a dielectric layer directly atop an epitaxial layer, patterning a hardmask layer over the dielectric layer, performing a first ion implant to form a set of wells in the epitaxial layer, and performing a second ion implant into the set of wells to form an interface layer between the set of wells and the dielectric layer.

BRIEF DESCRIPTION OF THE DRAWINGS

The accompanying drawings illustrate exemplary approaches of the disclosure, including the practical application of the principles thereof, as follows.

Figure 1:
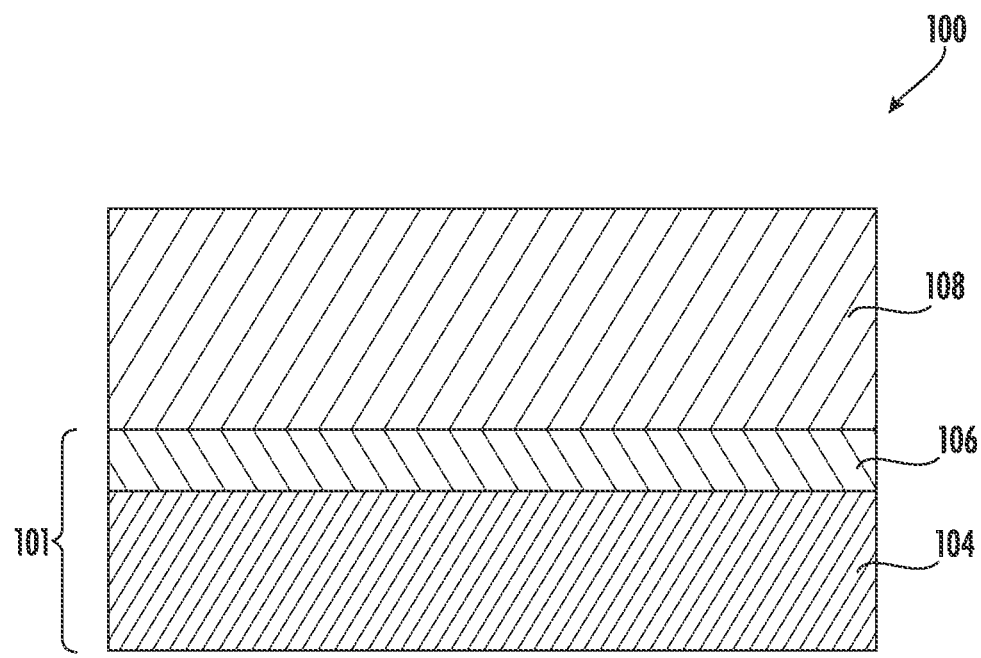
FIG. 1 is a cross-sectional side view of a device structure, according to embodiments of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where various embodiments are shown. The methods and devices may be embodied in many different forms and are not to be construed as being limited to the embodiments set forth herein. Instead, these embodiments are provided so the disclosure will be thorough and complete, and will fully convey the scope of the methods to those skilled in the art.

Embodiments described herein advantageously increase MOSFET threshold voltage to enable higher SiC mobility. In some embodiments, a room-temperature or high-temperature implantation step is added to a SiC trench MOSFET process flow, after well formation, to form an interface layer. The interface layer may be a layer of fluorine or chlorine formed along a top surface of the wells, below a dielectric layer.

FIG. 1 is a side cross-sectional view of a semiconductor device structure (hereinafter "device") 100, such as a MOSFET, according to one or more embodiments described herein. As shown, the device 100 may include a device structure 101 having an epitaxial layer 104, a dielectric layer 106 and a hardmask 108. Although non-limiting, the epitaxial layer 104 may be a silicon carbide (SiC) n-type drift layer formed atop a substrate (not shown). Shown as a single layer, the epitaxial layer 104 may include multiple layers in other embodiments. In various embodiments, the dielectric layer 106 may be SiO2 or SiN, and the hardmask 108 may be SiN, SiO2, polysilicon, and others.

Figure 2:
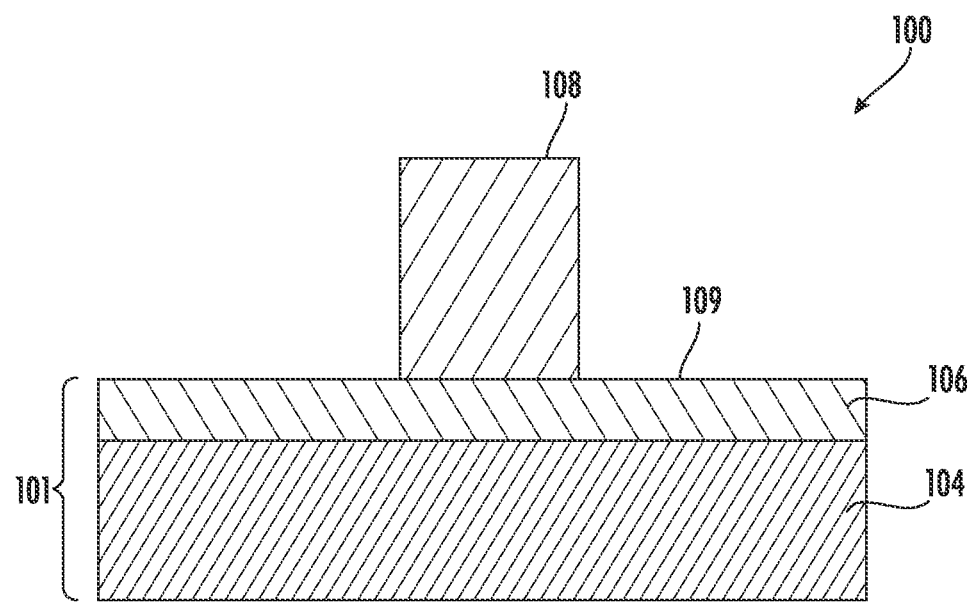
FIG. 2 is a cross-sectional side view of the device structure following hardmask patterning, according to embodiments of the present disclosure.
Figure 3:
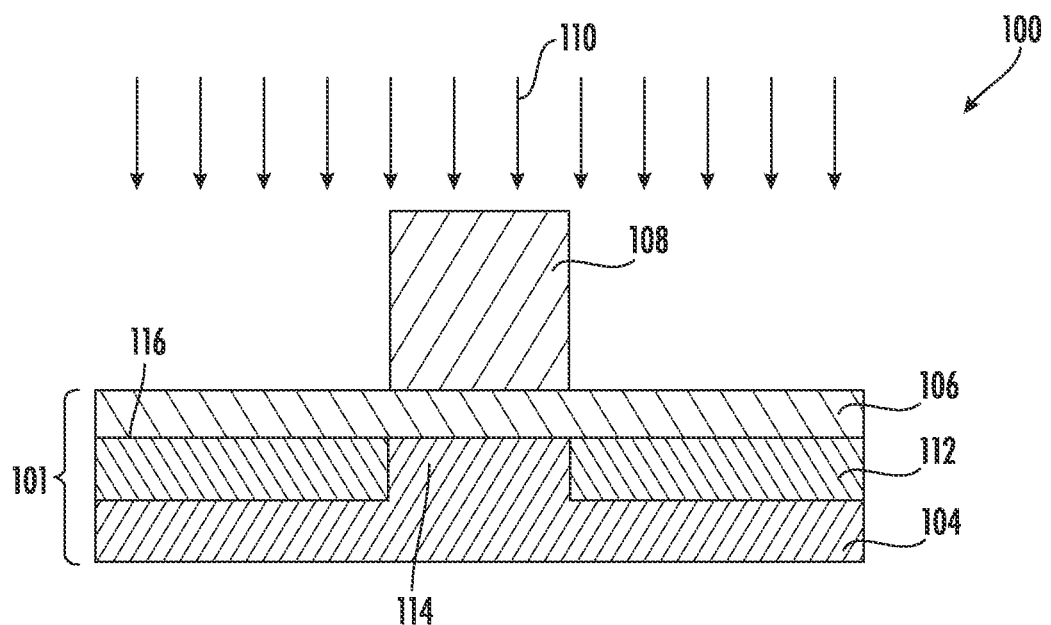
FIG. 3 is a cross-sectional side view of the device structure following formation of a set of wells, according to embodiments of the present disclosure.

The hardmask 108 may then be patterned (e.g., etched) selective to a top surface 109 of the dielectric layer 106, as shown in FIG. 2, and a first ion implant 110 may be performed to form a set of wells 112 in the epitaxial layer 104, as shown in FIG. 3. In some embodiments, the first ion implant 110 includes low-dose aluminum (Al) or boron (B) ions delivered into the epitaxial layer 104, through the dielectric layer 106, to form a set of P-type wells. As shown, a portion 114 of the epitaxial layer 104 covered by the patterned hardmask 108 is generally not impacted by the first ion implant 110. Once formed, a top surface 116 of each well 112 may be in direct contact or abutment with the dielectric layer 106.

Figure 4:
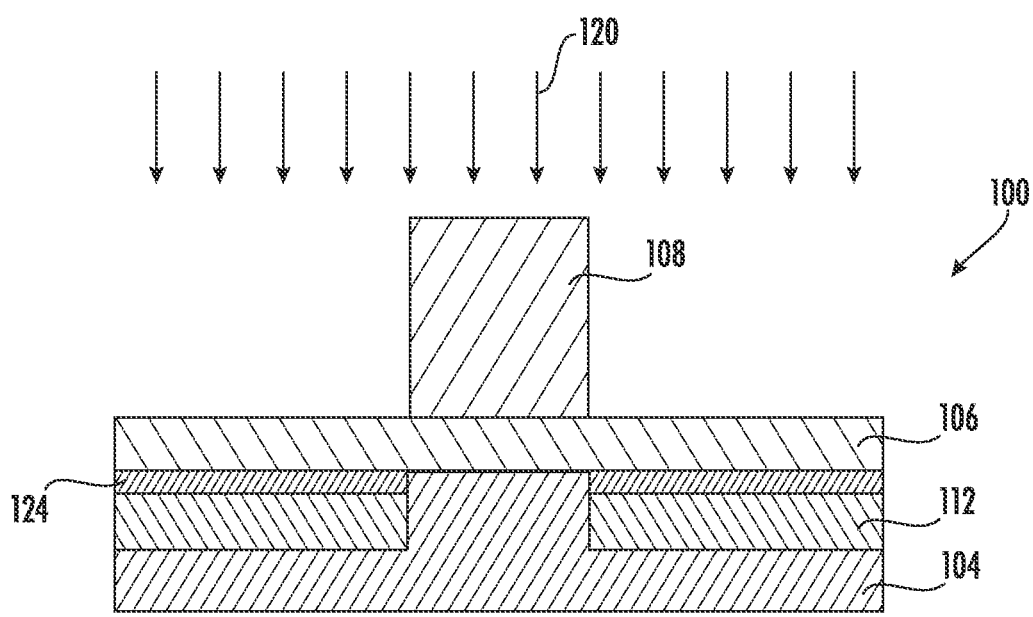
FIG. 4 is a cross-sectional side view of the device structure following formation of an interface layer, according to embodiments of the present disclosure.

A second ion implant 120 may then be performed, as shown in FIG. 4. In some embodiments, the second ion implant 120 includes implanting negatively charged ions, such as fluorine (F) or chlorine (Cl), into the wells 112 to form an interface layer 124. The interface layer 124 may be a thin layer of F or Cl positioned between the wells 112 and the dielectric layer 106. In various embodiments, the second ion implant 120 may be a room-temperature (e.g., between 15-30° Celsius) or a high-temperature ion implant. For example, the second ion implant 120 may be performed at temperatures between approximately 150° C. and 550° C. In some embodiments, the F or Cl ions may be implanted into the wells 112 while a platen 219 (FIG. 7) supporting the device structure 101 is at a temperature greater than 350° C.

In some embodiments, the second ion implant 120 may be a fluorine-based plasma treatment, such as a carbon tetrafluoride ($CF_4$), or a carbon tetrachloride ($CCl_4$) plasma treatment, which may be performed at a low energy. For example, the device 100 may be treated by CF plasma at an RF plasma power of approximately 150 W for approximately 150 s. It will be appreciated that the energy and treatment duration may be varied as desired in other embodiments. A rapid thermal annealing (RTA) process may then be performed after the plasma treatment. As a result, a high concentration of fluorine atoms may be formed in the wells 112 to generate the interface layer 124. Because of the strong electronegativity of the fluorine ions, the incorporated ions can provide immobile negative charges in the wells 112.

Figure 5:
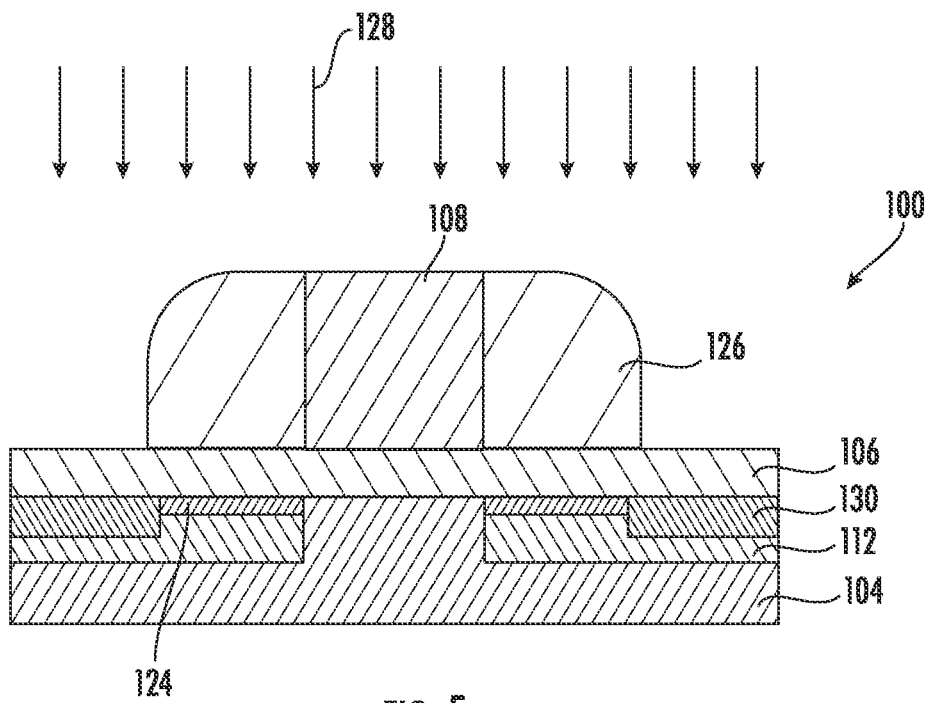
FIG. 5 is a cross-sectional side view of the device structure following formation of a set of contacts, according to embodiments of the present disclosure.

As shown in FIG. 5, a spacer 126 may be formed along the patterned hardmask 108, and a third ion implant 128 may be performed to form a contact 130 in each well 112. The contacts 130 may be further formed through the interface layer 124. In some embodiments, the third ion implant 128 may be a self-aligned N+ implant.

Figure 6:
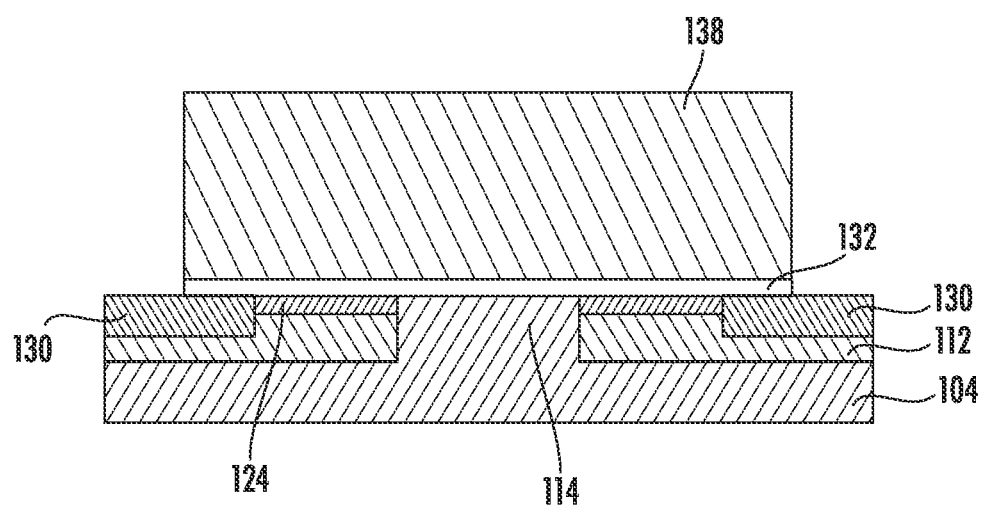
FIG. 6 is a cross-sectional side view of the device structure following formation of a gate material, according to embodiments of the present disclosure.

As shown in FIG. 6, the hardmask 108 and the dielectric layer 106 may be removed (e.g., etched), and the device structure 101 may be implanted to activate the dopants. An oxide layer 132 may be deposited directly atop the interface layer 124, the contacts 130, and the portion 114 of the epitaxial layer 104, and a gate material 138 (e.g., polysilicon) may then be deposited atop the oxide layer 132. In some embodiments, the oxide layer 132 is deposited instead of thermally grown to eliminate or reduce fluorine back diffusion into the epitaxial layer 104, which would reduce K value.

In one non-limiting example, dose and energy may be selected to accurately form the fluorine interface layer 124. Assuming a 50 nm $SiO_2$ pad dielectric on SiC, a 10 KeV Fluorine implantation may be performed, which forms the interface layer 124 to a depth of approximately 18 nm. Total charges in the SiC may equal dosex\ 2E-2. A 5E13 dose and a 1E12/$cm^2$ fix charges may provide a 2.3V Vt increase. This example falls into HC energy/dose range. Depending on pad dielectric thickness, implant energy can be from 100 eV to 60 KeV and dose can be from 1E11/$cm^2$ to 1E14/$cm^2$.

Figure 7:
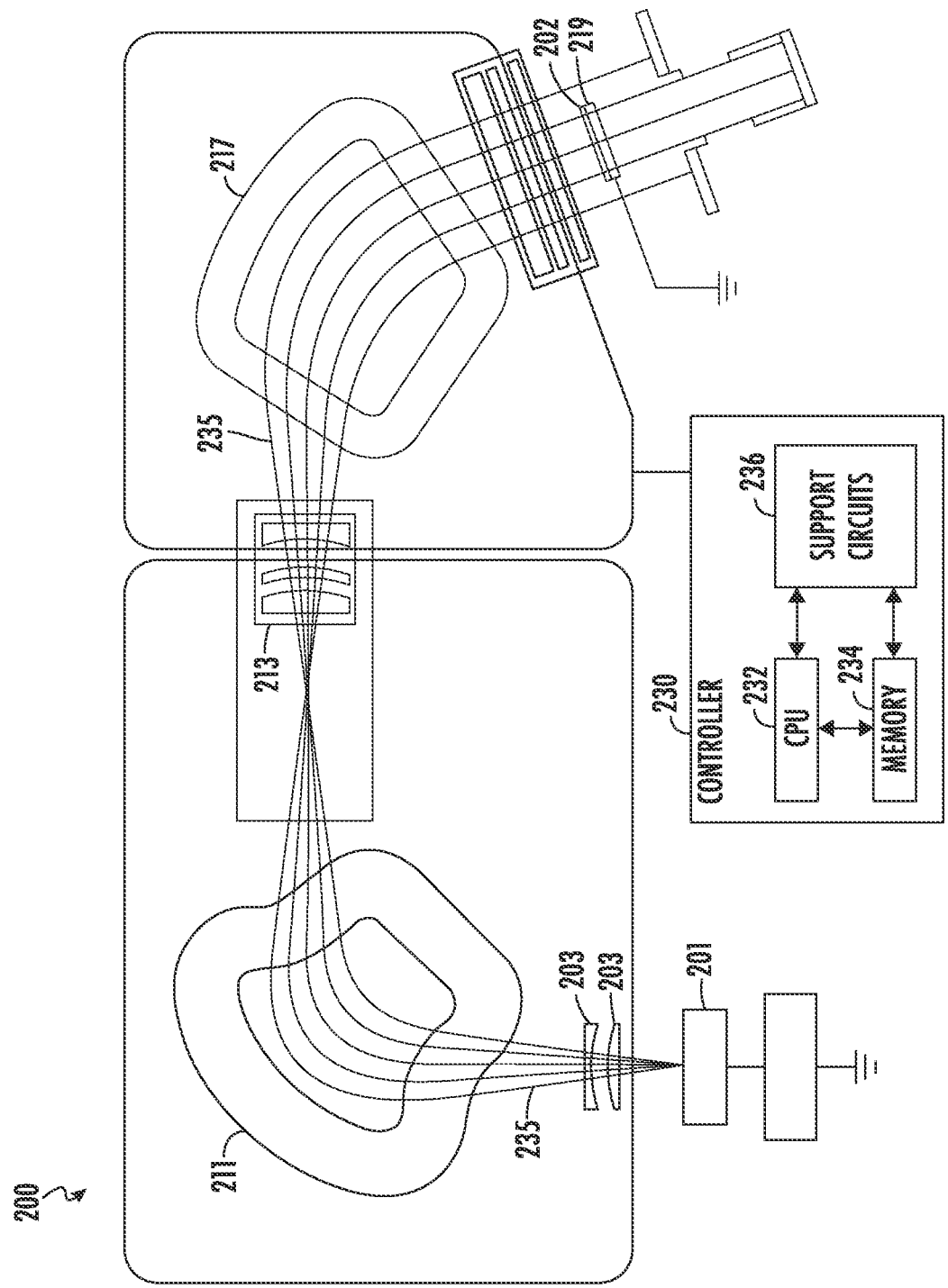
FIG. 7 illustrates a schematic diagram of a processing apparatus according to embodiments of the present disclosure.

FIG. 7 illustrates a schematic diagram of a processing apparatus 200 useful to perform processes described herein. One example of a beam-line ion implantation processing apparatus is the Varian VIISTA® Trident, available from Applied Materials Inc., Santa Clara, CA. The processing apparatus 200 may include an ion source 201 for generating ions. For example, the ion source 201 may provide an ion implant, such as the first ion implant 110, the second ion implant 120, and/or the third ion implant 128 described herein. The processing apparatus 200 may also include a series of beam-line components. Examples of beam-line components may include extraction electrodes 203, a magnetic mass analyzer 211, a plurality of lenses 213, and a beam parallelizer 217. The processing apparatus 200 may also include a platen 219 for supporting a substrate 202 to be processed. The substrate 202 may be the same as the substrate 102 described above. The substrate 202 may be moved in one or more dimensions (e.g. translate, rotate, tilt, etc.) by a component sometimes referred to as a "roplat" (not shown). It is also contemplated that the processing apparatus 200 may be configured to perform heated implantation processes to provide for improved control of implantation characteristics, such as the ion trajectory and implantation energy utilized to dope the substrate.

In operation, ions of the desired species, for example, dopant ions, are generated and extracted from the ion source 201. Thereafter, the extracted ions 235 travel in a beam-like state along the beam-line components and may be implanted in the substrate 202. Similar to a series of optical lenses that manipulate a light beam, the beam-line components manipulate the extracted ions 235 along the ion beam. In such a manner, the extracted ions 235 are manipulated by the beam-line components while the extracted ions 235 are directed toward the substrate 202. It is contemplated that the apparatus 200 may provide for improved mass selection to implant desired ions while reducing the probability of undesirable ions (impurities) being implanted in the substrate 202.

In some embodiments, the processing apparatus 200 can be controlled by a processor-based system controller such as controller 230. For example, the controller 230 may be configured to control beam-line components and processing parameters associated with beam-line ion implantation processes. The controller 230 may include a programmable central processing unit (CPU) 232 that is operable with a memory 234 and a mass storage device, an input control unit, and a display unit (not shown), such as power supplies, clocks, cache, input/output (I/O) circuits, and the like, coupled to the various components of the processing apparatus 200 to facilitate control of the substrate processing. The controller 230 also includes hardware for monitoring substrate processing through sensors in the processing apparatus 200, including sensors monitoring the substrate position and sensors configured to receive feedback from and control a heating apparatus coupled to the processing apparatus 200. Other sensors that measure system parameters such as substrate temperature and the like, may also provide information to the controller 230.

To facilitate control of the processing apparatus 200 described above, the CPU 232 may be one of any form of general-purpose computer processor that can be used in an industrial setting, such as a programmable logic controller (PLC), for controlling various chambers and sub-processors. The memory 234 is coupled to the CPU 232 and the memory 234 is non-transitory and may be one or more of readily available memory such as random access memory (RAM), read only memory (ROM), floppy disk drive, hard disk, or any other form of digital storage, local or remote. Support circuits 236 may be coupled to the CPU 232 for supporting the processor in a conventional manner. Implantation and other processes are generally stored in the memory 234, typically as a software routine. The software routine may also be stored and/or executed by a second CPU (not shown) that is remotely located from the hardware being controlled by the CPU 232.

For the sake of convenience and clarity, terms such as "top," "bottom," "upper," "lower," "vertical," "horizontal," "lateral," and "longitudinal" will be understood as describing the relative placement and orientation of components and their constituent parts as appearing in the figures. The terminology will include the words specifically mentioned, derivatives thereof, and words of similar import.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including yet not limited to, for example: chemical vapor deposition (CVD), low-pressure CVD (LPCVD), and plasma-enhanced CVD (PECVD). Additional techniques may include semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), and sputtering deposition. Additional techniques may include ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Unless indicated otherwise, each part of a MOSFET can be made of material(s) well-known to one skilled person in the art. A semiconductor material may comprise, for example, a III-V group semiconductor material such as GaAs, InP, GaN and SiC, or a IV group semiconductor such as Si and Ge. A gate conductor may comprise any of various conductive materials, for example, metal, doped polysilicon, a multilayer gate conductor including a metal layer and a doped polysilicon layer, or any other conductive material, such as TaC, TiN, TaTbN, TaErN, TaYbN, TaSiN, HfSiN, MoSiN, RuTax, NiTax, MoNx, TiSiN, TiCN, TaAlC, TiAlN, TaN, PtSix, $Ni_3Si$, Pt, Ru, Ir, Mo, HfRu, RuOx, or any combination thereof. A gate dielectric may comprise $SiO_2$ or any other dielectric material which has a dielectric constant greater than that of $SiO_2$, such as oxide, nitride, oxynitride, silicate, aluminate, or titanate. The oxide may include, for example, $SiO_2$, $HfO_2$, $ZrO_2$, $Al_2O_3$, $TiO_2$, or $La_2O_3$. The nitride may include, for example, $Si_3N_4$. The silicate may include, for example, HfSiOx. The aluminate may include, for example, $LaAlO_3$. The titanate may include, for example, $SrTiO_3$. The oxynitride may include, for example, SiON. Moreover, the gate dielectric may comprise any material that will be developed in the future, besides the above known materials.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    providing a device structure including a dielectric layer over an epitaxial layer;
    patterning a hardmask layer over the dielectric layer;
    performing a first ion implant to form a well in the epitaxial layer;
    performing a second ion implant to form an interface layer between the well and the dielectric layer;
    forming a spacer along the patterned hardmask layer after the second ion implant is performed;
    forming a contact in the well by directing a third ion implant through the dielectric layer;
    forming an oxide layer directly atop the interface layer and the contact; and
    forming a gate material over the oxide layer.

2. The method of claim 1, further comprising removing the patterned hardmask layer and the dielectric layer selective to the interface layer and to the contact, wherein the gate material is formed directly atop the oxide layer.

3. The method of claim 1, further comprising delivering the first ion implant and the second ion implant through the dielectric layer.

4. The method of claim 1, wherein performing the first ion implant comprises delivering aluminum ions or boron ions into the epitaxial layer, wherein the epitaxial layer is silicon carbide, and wherein performing the second ion implant comprises delivering fluorine ions into the well.

5. The method of claim 4, further comprising delivering the fluorine ions into the well while a platen supporting the device structure is at a temperature greater than 350° C.

6. The method of claim 1, wherein the second ion implant is a plasma treatment.

7. A method of forming a MOSFET, comprising:
    providing a device structure including a dielectric layer directly atop an epitaxial layer;
    patterning a hardmask layer over the dielectric layer;
    performing a first ion implant to form a set of wells in the epitaxial layer;
    performing a second ion implant to form an interface layer between the set of wells and the dielectric layer, wherein performing the first ion implant comprises delivering aluminum ions or boron ions into the epitaxial layer, wherein the epitaxial layer is silicon carbide, and wherein performing the second ion implant comprises delivering fluorine ions into the set of wells;
forming a spacer along the patterned hardmask layer after the second ion implant is performed;
forming a contact in each well of the set of wells;
forming an oxide layer directly atop the interface layer and the contact; and
forming a gate material over the oxide layer.

8. The method of claim 7, further comprising performing a third ion implant to form the contact in each well of the set of wells.

9. The method of claim 8, further comprising removing the patterned hardmask layer and the dielectric layer selective to the interface layer and to the contact, wherein the gate material is formed directly atop the oxide layer.

10. The method of claim 8, further comprising delivering the first ion implant, the second ion implant, and the third ion implant through the dielectric layer.

11. The method of claim 7, further comprising delivering the fluorine ions into the set of wells while a platen supporting the device structure is at a temperature greater than 350° C.

12. A method for increasing MOSFET threshold voltage, comprising:
providing a device structure including a dielectric layer directly atop an epitaxial layer, wherein the epitaxial layer is a layer of silicon carbide;
patterning a hardmask layer over the dielectric layer;
performing a first ion implant to form a set of wells in the epitaxial layer;
performing a second ion implant into the set of wells to form an interface layer between the set of wells and the dielectric layer;
forming a spacer along the patterned hardmask layer after the second ion implant is performed;
performing a third ion implant to form a contact in each of the set of wells, wherein the third ion implant is directed through the interface layer;
forming an oxide layer directly atop the interface layer and the contact; and
forming a gate material over the oxide layer.

13. The method of claim 12, further comprising removing the patterned hardmask layer and the dielectric layer selective to the interface layer and to the contact, wherein the gate material is formed directly atop the oxide layer.

14. The method of claim 12, further comprising delivering the first ion implant, the second ion implant, and the third ion implant through the dielectric layer.

15. The method of claim 12, wherein performing the first ion implant comprises delivering aluminum ions or boron ions into the epitaxial layer, and wherein performing the second ion implant comprises delivering fluorine ions into the set of wells.

16. The method of claim 15, further comprising delivering the fluorine ions into the set of wells while a platen supporting the device structure is at a temperature greater than 350° C.

* * * * *